United States Patent [19]

Müller et al.

[11] 4,204,056

[45] May 20, 1980

[54] PROCESS AND INTERMEDIATES FOR PREPARING FIBER-REACTIVE PHTHALOCYANINE DYES

[75] Inventors: Rolf Müller, Karben; Joachim Ribka, Offenbach am Main-Bürgel, both of United Kingdom

[73] Assignee: Cassella Aktiengesellchaft, Frankfurt am Main Fechenheim, Fed. Rep. of Germany

[21] Appl. No.: 944,641

[22] Filed: Sep. 21, 1978

Related U.S. Application Data

[62] Division of Ser. No. 786,819, Apr. 12, 1977.

[30] Foreign Application Priority Data

Apr. 17, 1976 [DE] Fed. Rep. of Germany ....... 2617062

[51] Int. Cl.$^2$ .............................................. C07B 47/04

[52] U.S. Cl. ................................. 542/416; 260/314.5; 260/146 R; 260/146 D; 260/146 T; 260/147; 260/162; 260/163

[58] Field of Search ...................... 260/314.5; 542/416

[56] References Cited

U.S. PATENT DOCUMENTS

| | | | |
|---|---|---|---|
| 2,413,224 | 12/1946 | Fox | 260/314.5 |
| 3,047,582 | 7/1962 | Bienert | 260/314.5 |
| 3,625,936 | 12/1971 | Meininger | 260/147 |
| 4,048,189 | 9/1977 | Kienzle | 260/314.5 |

*Primary Examiner*—Natalie Trousof
*Assistant Examiner*—Jane T. Fan
*Attorney, Agent, or Firm*—Connolly and Hutz

[57] ABSTRACT

Process for preparing fiber-reactive water-soluble phthalocyanine azo dyes, using the following conversion stages

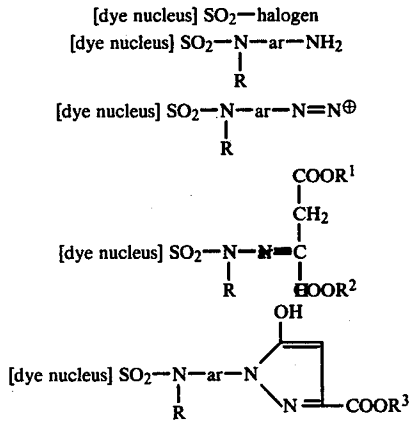

followed by the diazonium coupling of the fiber-reactive group to the pyrazole ring. The novel intermediates are desirable products.

1 Claim, No Drawings

PROCESS AND INTERMEDIATES FOR PREPARING FIBER-REACTIVE PHTHALOCYANINE DYES

This application is a division of application Ser. No. 786,819 pending filed Apr. 12, 1977.

The present invention relates to the preparation of water-soluble fiber-reactive phthalocyanine dyes such as those described in German Patent No. 1,095,429 and in Japanese patent application Sho-43-72,370 published Oct. 9, 1971 under publication No. Sho-46-34,510.

Among the objects of the present invention is the provision of improved techniques for preparing phthalocyanine dyes that are water-soluble and fiber-reactive, as well as the provision of novel intermediates therefor.

The foregoing and additional object of the present invention will be more fully understood from the following description of several of its exemplifications.

According to the present invention water-soluble fiber-reactive phthalocyanine dyes are very conveniently produced from phthalocyanine dyes that are not fiber-reactive but whose nuclei contain at least one sulfonyl halide group. This group is converted to

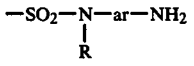

I and then diazotized and further converted to

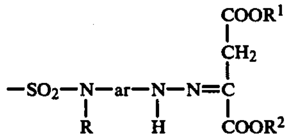

II which is then cyclized to

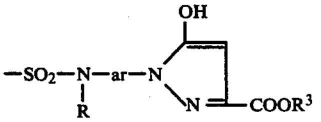

III so that a diazonium compound carrying a fiber-reactive group can be affixed to the pyrazole ring by a diazonium coupling reaction.

The entire sequence of reactions is readily effected and each reaction step goes very cleanly with essentially quantitative conversion and so significant by-product formation.

In the formulae,

R stands for hydrogen or alkyl having up to 6 carbons, $R^1$ stands for hydrocarbyl having up to 18 carbons, $R^2$ stands for hydrocarbyl having up to 18 carbons, and $R^3$ stands for $R^2$ and additionally for hydrogen, and ar stands for a carbocyclic divalent aromatic or aralkyl group containing up to two benzene rings and up to 16 carbons, a benzene ring carrying the hydrazone nitrogens.

Phthalocyanine hydrazones containing at least one group of the formula II represent novel intermediates having not yet been described.

As mentioned above, they are readily obtained by diazotizing a phthalocyanine containing a corresponding number of sulfonylamide groups of formula I and coupling the diazotized material with a keto-succinic acid ester

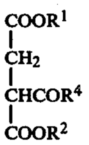

IV in which $R^4$ is hydrogen, hydrocarbyl having up to 10 carbons and alkoxycarbonyl having 2 to 6 carbons and $R^1$ and $R^2$ are as defined above.

The group $R^4$ of the keto-succinic acid ester is split off together with the bridging —CO-group by coupling the diazotized sulfonylamides with the keto-succinic acid ester.

The diazotization of the sulfonylamides I can be effected in known manner in an aqueous acid medium by reaction with nitrous acid or an agent which splits off nitrous acid. A salt of nitrous acid, especially an alkali metal salt, such as sodium or potassium nitrite, is generally employed in a mineral acid medium as an agent which splits off nitrous acid. In a preferred embodiment, the neutral aqueous solution of the sulfonylamide is treated with a solution of a stoichiometric amount of sodium nitrite and this mixture is then run, while stirring, into at least 2.5 mols, preferably 3 mols, of dilute, approximately 5–15% strength hydrochloric acid per mol of amino group present, at temperatures between $-5°$ and $+25°$ C., preferably $-2°$ to $+5°$ C. The diazo suspension thus obtained is then reacted with the succinic acid derivative of the formula IV at a pH between 3 and 8, preferably between 4.5 and 5.5, for example by adding the succinic acid derivative to the acid suspension of the diazonium compounds and then adjusting the pH value to the desired figure by the addition of alkali, for example sodium hydroxide, sodium carbonate, sodium bicarbonate, sodium acetate, potassium carbonate or sodium phosphate.

The aqueous medium in which the coupling of the diazotized amines with the succinic acid derivatives of formula IV is carried out can also contain organic, water-miscible solvents, especially lower aliphatic alcohols, such as for example methanol, ethanol or isopropanol. In the same way, known coupling accelerators, such as, for example urea or pyridine, can be present during the coupling reaction.

After stirring for 1 to 3 hours unreacted diazotized amine can no longer be detected and the formation of the hydrazone is complete. It can be separated out from the solution by salting out, that is to say be adding a neutral, water-soluble salt, such as for example sodium chloride or potassium chloride.

It is difficult to free the hydrazone from inorganic salts used for salting out even though it can be done by extraction or dialysis.

The pure hydrazones are stable solids of dark greenish blue color. On heating up to about 250° they slowly decompose without showing sharp melting or decomposition points.

In aqueous solution the novel phthalocyanine hydrazones absorb in the visual region of the electromagnetic spectrum at 620 nm and 655 nm, the short-wave band having an extinction value being about 10% higher than that of the long-wave band. The absolute extinction values are dependent on the molecular weight of the hydrazone measured and, if the salt-containing products are measured, on the salt content.

For analytical purposes it is not necessary to remove any salt from the products salted out and it is not even necessary to separate the hydrazones from aqueous solutions. For the purpose of gravimetric analysis of the compounds it is of advantage to use a salt-containing product and draw all analytical values to the analytical value of the central heavy-metal atom of the phthalocyanine nucleus. Qualitative determination of the hydrazones in solutions may easily be performed by evaluating the visual spectrum of the solutions along the lines given above.

Quantitative determination of the hydrazone content in aqueous solutions may be easily made by adding alkali to the solution to obtain a slightly alkaline pH value, by stirring the solution for 5 to 10 minutes, and by subsequent titration of the equivalent of phthalocyanine pyrazolone thus obtained by means of a standardized solution of p-nitrophenyl diazonium-chloride, using paper impregnated with a R-salt solution as indicator for excess diazonium compound, i.e. for the determination of the end-point. Separation of the hydrazone is, however, in no way necessary for the further processing of the hydrazones according to the invention; on the other hand, it is appropriate and advantageous to employ the reaction solutions obtained in the coupling reaction directly for further processing.

The hydrazones of the present invention are valuable intermediate products for the manufacture of the desired fiber-reactive phthalocyanine dyes. Their conversion to the final dye is very easily effected in very high yields with no significant by-product problems.

In general the ar group of the formulas I, II and III can be m-phenylene
p-phenylene

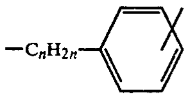

where n is an integer from 1 through 10

1,3-naphthylene
1,4-naphthylene
1,5-naphthylene
1,8-naphthylene
2,6-naphthylene
2,7-naphthylene -continued

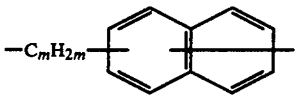

where m is an integer from 1 through 6 and the right-hand slash line represents a bond located at any unsubstituted location in either ring

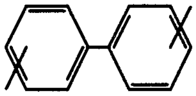

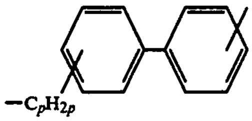

where p is an integer from 1 through 4

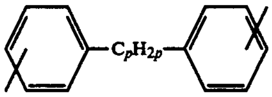

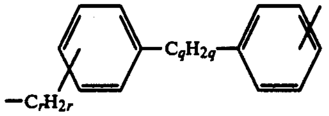

where q and r are each 1 through 3 and q + r totals no more than 4 and the following additional groups which the art considers to be aromatic in nature

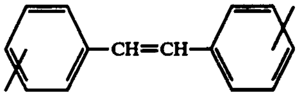

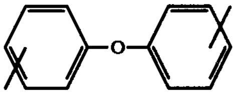

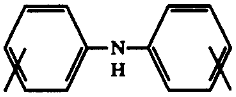

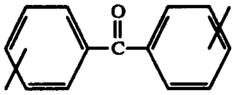

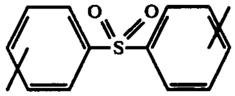

and alkylene-linked modifications of these. Preferred are the phenylenes, the naphthylenes,

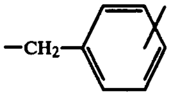

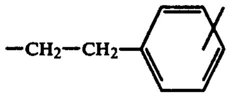

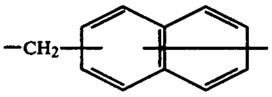

, and

-continued

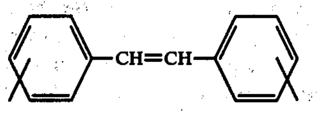

As noted above the ar has an aromatic carbon bonded to the the nitrogen that is to be diazotized. Such benzene ring can be fused to another ring or it can be unfused.

The aromatic rings of the above divalent groups standing for ar may be further substituted.

Appropriately, they contain at least one sulpho group or carboxyl group, but valuable hydrazones according to the invention can also be obtained with radicals which have the general definition or ar and which contain no acid group. In addition, the hydrocarbon radical can be substituted in each nucleus by one substituent of the group —OH, alkoxy having 1 to 4 C atoms —CN, —$CF_3$ or —$SO_2R^5$ or an additional —$SO_3H$ group, or by one or two identical or different substituents of the groups halogen,

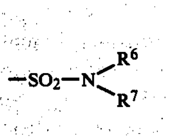

or —COOH. If ar is derived from a phenylene radical, it can be substituted, additionally to a —$SO_3H$ group which may perhaps be present, by one to three identical or different alkyl radicals having 1 to 4 C atoms. Phthalocyanine hydrazones, according to the invention, in which ar is phenylene or phenylene substituted by one or two carboxyl groups or by one or two sulpho groups or a naphthylene radical which is substituted by one or two sulpho groups or a stilbenyl radical which is substituted by two sulpho groups, and especially these hydrazones in which ar is a radical of the formula

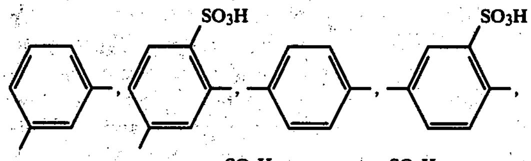

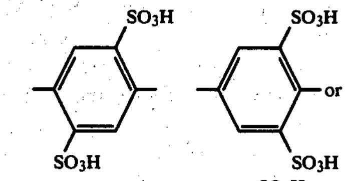

or

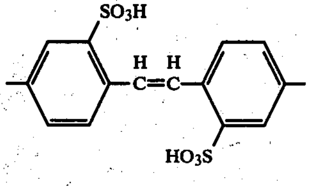

wherein the position shown here corresponds to the position in the general formula I, are particularly preferred.

Hydrocarbyl groups standing for R are methyl, carboxymethyl, sulphomethyl or alkyl radicals which contain 2-6 atoms and are optionally substituted by Cl, Br, OH, alkoxy having 1-6 C atoms, alkanoylamino having 1-6 C atoms, benzoylamino, alkanoyloxy having 1-6 C atoms, —COOH or $SO_3H$.

Preferably, R denotes hydrogen, methyl, carboxymethyl, sulphomethyl or an ethyl radical which is optionally substituted by Cl, OH, alkoxy having 1 or 2 C atoms, —COOH or $SO_3H$, and particularly denotes hydrogen or methyl.

The hydrocarbyl group standing for $R^1$ is an alkyl radical which has 2-6 C atoms and is substituted by Cl, Br, OH or alkoxy having 1-4 C atoms, or an unsubstituted alkyl radical having 1-18 C atoms, preferably an ethyl radical which is substituted by Cl, OH or alkoxy having 1-2 C atoms or an unsubstituted alkyl radical having 1-6 C atoms.

The hydrocarbyl $R^2$ occurring in formula II denotes an alkyl radical which has 2-6 C atoms and is substituted by Cl, Br, OH or alkoxy having 1-4 C atoms, or denotes an unsubstituted alkyl radical having 1-18 C atoms and preferably an ethyl radical which is substituted by Cl, OH or alkoxy having 1-2 atoms, or denotes an unsubstituted alkyl radical having 1-6 C atoms.

Phthalocyanine hydrazones, according to the invention, in which $R^1$ and $R^2$ are identical and denote methyl or ethyl, are particularly advantageous.

$R^3$ has the same meanings as $R^2$ but may additionally denote hydrogen.

Hydrocarbyl groups standing for $R^4$ are alkyl radicals which have 1-10 C atoms and are optionally substituted by alkoxy having 1-4 C atoms or alkoxycarbonyl having 2-6 C atoms, a phenyl radical which is optionally substituted by Cl, Br, alkyl or alkoxy having 1-4 C atoms, or alkoxycarbonyl having 2-6 atoms, preferably, $R^4$ denotes alkyl having 1-4 C atoms, phenyl, methylphenyl or alkoxycarbonyl having 2 or 3 C atoms. The methyl group is particularly preferred for $R^4$.

$R^5$ occurring in the substituent —$SO_2R^5$ of the ar group denotes methyl, carboxymethyl, sulphomethyl, alkyl which has 2 or 3 C atoms and is optionally substituted by Cl, OH, alkoxy having 1-3 C atoms, acetylamino, acetoxy, —COOH or —$SO_3H$, benzyl or phenyl, it being possible for the aromatic nuclei to be mono-substituted or disubstituted by —COOH or —$SO_3H$, preferably, it denotes methyl and ethyl.

In the substituent

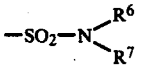

of the ar group $R^6$ denotes hydrogen, methyl, carboxymethyl, sulfomethyl, an alkyl radical which has 2-6 C atoms and which is optionally substituted by Cl, Br, OH, alkoxy having 1-6 C atoms, alkanoylamino having 1-6 C atoms, preferably acetylamino, benzoylamino, alkanoyloxy having 1-6 C atoms, preferably acetoxy, —COOH or —$SO_3H$, a phenalkyl or naphthalkyl radical having 1-3 C atoms in the aliphatic chain, or phenyl or naphthyl, it being possible for the aromatic nuclei to be substituted by Cl, Br, OH, alkyl and/or alkoxy having 1-6 C atoms, alkanoylamino having 1-6 C atoms, —COOH or —$SO_3H$ and $R^7$ denotes hydrogen, methyl, carboxymethyl, sulphomethyl, an alkyl radical which contains 2-6 C atoms and which is optionally substituted by Cl, Br, OH, alkoxy having 1-6 C atoms, alkanoylamino having 1-6 C atoms, benzoylamino, alkanoyloxy having 1-6 C atoms, —COOH or —$SO_3H$, or an unsubstituted alkyl radical having 6-20 C atoms.

Preferably $R^6$ denotes hydrogen, an alkyl radical which contains 2 or 3 C atoms and is optionally substituted by OH, alkoxy having 1-3 C atoms, —COOH or $SO_3H$, methyl, carboxymethyl or sulphomethyl, and $R^7$ denotes an alkyl radical which has 2 or 3 C atoms and which is optionally substituted by OH, alkoxy having 1-3 C atoms, —COOH or —$SO_3H$, or denotes an unsubstituted alkyl radical having 1-20 C atoms, but especially denotes hydrogen, methyl, carboxymethyl or an alkyl radical which has 2 or 3 C atoms and which is optionally substituted by OH.

Particularly preferred meanings for $R^6$ and $R^7$ are hydrogen, alkyl having 1 to 4 carbons and β-hydroxyethyl.

The phthalocyanine amides having at least one group of the formula I are prepared by condensation of phthalocyanine sulfochlorides with aromatic or araliphatic diamines of the formula $$\underset{\displaystyle R}{\overset{}{HN}}\!-\!ar\!-\!NH_2$$

wherein ar has the meaning given above.

If phthalocyanine amides are desired whose group ar bears substituents as given above, the phthalocyanine sulfochlorides are condensed with diamines $$\underset{\displaystyle R}{\overset{}{HN}}\!-\!ar\!-\!NH_2$$

whose group ar bears the desired substituents. Where the ar-diamine has an unsymmetrical structure, its condensation to the sulfochloride can be effected by first blocking the amine group that is not to condense, as by acetylation. After the condensation the blocking group is split off to leave a primary amine group that can be diazotized. The condensation reaction is known per se. It is described DAS No. 1,769,398 and DAS 1,289,206.

As described in the above named literature references, the reaction of the phthalocyanine sulfochloride with the said amines can be carried out as by adding the amine to a concentrated aqueous suspension of the sulfochloride in water or a mixture of water and organic, water-miscible solvents. The reaction can, however, also be carried out in organic solvents alone. The temperature of the reaction mixture is preferably kept at 0° to 35° C. and the pH value, which is continously displaced into the acid range during the reaction is kept between 4 and 10, preferably between 6 and 8, by gradual addition of alkali. Alkalis which can be used are the customary substances with an alkaline reaction, such as sodium hydroxide solution, sodium carbonate, potassium carbonate or trisodium phosphate. Sodium hydroxide solution is preferred. It is advantageous to add a tertiary amine, such as, for example, pyridine, in catalytic quantities in order to accelerate the reaction.

It is possible to process further the sulfonyl amides of formula I in the aqueous solution in which they are produced, but it is advantageous to isolate them in order to free them from the small amount of incompletely reacted reactants which are usually present in the mother liquor.

Isolation of the sulfamides may be carried out by acidifying and salting out in the same manner as is described above for the hydrazones.

The following may be mentioned as examples of diamines $$\underset{\displaystyle R}{\overset{}{HN}}\!-\!ar\!-\!NH_2$$

which can be used as such or in monoacylated form: p-phenylenediamine, N-methyl-p-phenylenediamine, N-carboxymethyl-p-phenylenediamine, m-phenylenediamine N-β-hydroxyethyl-m-phenylenediamine, 1,4-phenylenediamine-2-sulphonic acid, 1-amino-4-N-sulphomethylamino-phenylene-2-sulphonic acid, 1,4-phenylenediamine-2,5- or 2,6-disulphonic acid, 1-amino-4-N-methylamino-phenylene-2,6-disulphonic acid, 1,3-phenylenediamine-4-sulphonic acid, 1,3-phenylenediamine-4,6-disulphonic acid, 2,4-diamino-toluene-5- or -6-sulphonic acid, 2,6-diamino-toluene-4-sulphonic acid, 2,5-diamino-1,3,5-trimethylbenzene-4-sulphonic acid, 2,6-diamino-1,3-diethylbenzene-4-sulphonic acid, 2,4-diamino-1-chlorobenzene-6-sulphonic acid, 2,4-diamino-1-tert.-butyl-benzene-6-sulphonic acid, 2,4-diaminotoluene-5- or -6-sulphamide, 2,6-diamino-toluene 4-ethanol-sulphamide or 2,6-diaminotoluene-diethanolsulphamide, 1,4-diaminophenylene-2-dimethylsulphamide, 1,3-diaminophenylene-4-sulphanilide, 1,3-diaminophenylene-4-β-hydroxyethyl-sulphone, N-ethyl-p-phenylenediamine, N-propyl-p-phenylenediamine, N-butyl-p-phenylenediamine, N-pentyl-p-phenylenediamine, N-hexyl-p-phenylenediamine, N-β-hydroxy-propyl-p-phenylenediamine, N-β-carboxy-propyl-p-phenylenediamine, N-γ-chlorobutyl-p-phenylenediamine, N-δ-methoxy-butyl-p-phenylenediamine, N-β-propoxy-butyl-p-phenylenediamine, N-β-acetylamino-ethyl-p-phenylenediamine, N-β-butyrylamino-ethyl-p-phenylenediamine, N-benzoylamino-ethyl-p-phenylenediamine, 1-N-methyl-3-aminobenzene-4-sulphonic acid, 1-N-butyl-4-amino-benzene-3-sulphonic acid, 2,4-diamino-phenol-6-sulphonic acid, 2,4-diamino-1-methoxybenzene-5-sulphonic acid, 1,5-diaminonaphthalene, 1,5-diaminonaphthalene-3-sulphonic acid, 1,5-diaminonaphthalene-4-sulphonic acid, 1,5-diaminonaphthalene-2-sulphonic acid, 1,6-diaminonaphthalene-4-sulphonic acid, 1,4-diaminonaphthalene-2-sulphonic acid, 1,4-diaminonaphthalene-5-sulphonic acid, 1,4-diaminonaphthalene-7-sulphonic acid, 1,8-diaminonaphthalene-4-sulphonic acid, 2,6-diaminonaphthalene-8-sulphonic acid, 2,6-diaminonaphthalene-4,8-disulphonic acid, 1,5-diaminonaphthalene-3,7-disulphonic acid, 1,4- diaminonaphthalene-5-carboxylic acid, 1,4-diaminonaphthalene-2-carboxylic acid, 1,8-diaminonaphthalene-3-carboxylic acid, 4,4'-diaminodiphenyl, 2,2'-dimethyl-4,4'-diaminodiphenyl, 3,3'-dichloro-4,4'-diaminodiphenyl, 4,4'-diaminodiphenyl-2,2'-disulphonic acid, 3,3'-dimethoxy-4,4' -diaminodiphenyl, 1-amino-4-aminomethyl-benzene, 1-amino-4-aminomethyl-benzene-3-sulphonic acid, 1-amino-4-β-aminoethyl-benzene-2-sulphonic acid, 1-amino-4-γ-aminopropyl-benzene-3-sulphonic acid, 2-amino-5-aminomethyl-naphthalene-1-sulphonic acid, 4,4'-diaminodiphenylmethane-2,2'-disulphonic acid, 4,4'-diamino-diphenylethane-2,2'-disulphonic acid, 4,4'-diamino-diphenylethane-mono-sulphamide, 4,4'-diamino-diphenylethane-disulphamide, 4,4'-diaminostilbene-2,2'-disulphonic acid 4,4'-diaminodiphenylmethane, 4,4'-diamino-diphenylethane-di-β-hydroxyethyl-sulphamide, 4,4'-diamino-diphenylamine-3-sulphonic acid, 3,4'-diamino-6-methoxy-diphenylamine-2'-sulphonic acid, 3,4'-diamino-4-methyl-diphenylamine-2'-sulphonic acid, 3,3'-diaminobenzophenone-5,5'-disulphonic acid, 3,4'-diaminobenzophenone-3'-sulphonic acid, 4,4'-diamino-diphenyl sulphone, 4,4'-dichloro-3,3'-diamino-diphenyl sulphone, 3,3'-diamino-4-methyl-diphenyl-sulphone-5-sulphonic acid and 3,3'-diamino-diphenylsulphone-4,4'-disulphonic acid.

The ketosuccinic acid esters IV are well-known prior art compounds, and are described for instance in U.S. Pat. No. 3,786,083 and in "Organic Syntheses" XIV (1934), p. 38.

Preferred succinic acid derivatives are those in which $R^2$ denotes an alkyl radical with 2-6, preferably 2, carbons and which is substituted by Cl, OH or alkoxy with 1-4, preferably 1-2, carbons, or an unsubstituted alkyl radical with 1-18, preferably 1-6, carbons, $R^1$ denotes an ethyl radical which is substituted Cl, OH or alkoxy with 1-2 carbons or an unsubstituted alkyl radical with 1-6 carbons, and $R^4$ denotes hydrogen, alkyl with 1-4 carbons, phenyl, methylphenyl or alkoxycarbonyl with 2 or 3 carbons.

Succinic acid derivates in which $R^1$ and $R^2$ are identical and denote methyl or ethyl, and $R^4$ represents a methyl group, are particularly preferred.

The phthalocyanine sulfohalides used as starting material for the process of the present invention have the —$SO_3$hal group preferably in the 3-position of the phthalocyanine nucleus, the 3-position being on a benzene ring ortho to the isoindole ring to which the benzene ring is fused. However 4-sulfonylhalide-substituted phthalocyanines can also be used for the present invention, as can phthalocyanines containing two, three or four sulfonylhalide groups of either or both kinds. Such sulfonylhalides are also generally called "sulfohalides".

The phthalocyanine sulfohalides are well known compounds, produced by known processes. Those sulfohalides having the —$SO_2$hal group in 3-position are produced by reacting the phthalocyanine with halosulfonic acid $HSO_3$hal, sulfohalides having the —$SO_3$hal groups in 4-position are produced by reacting phthalocyanine-4-sulfonic acids with halosulfonic acid, thionylhalide or phosphorus halide under conditions described in more detail e.g. in "Venkataraman, The Chemistry of Synthetic Dyes", Vol. V, p. 261 (1971).

Phthalocyanine-4-sulfonic acids can be prepared by condensation of 4-sulfophthalimides as described, e.g. in "Venkataraman, The Chemistry of Synthetic Dyes", Vol. V, p. 260, (1971).

Both methods can be combined to obtain mixed sulfonylhalides.

Preferred as starting material for the process of the present invention are those in which the sulfonylhalide group is a sulfonylchloride group —$SO_2Cl$.

Al least one —$SO_2Cl$ group of the starting material has to be condensed with the ar diamine as described above. If more than one —$SO_2Cl$ group is present in the phthalocyanine sulfochloride all these groups may be condensed with the ar diamine but it is also possible to partially react them with a monoamine of the formula $$H—NR^6R^7$$

which results in the formation of —$SO_2$—$NR^6R^7$ groups linked to the phthalocyanine nucleus. Hence, a poly-sulfochlorided phthalocyanine dye nucleus can be simultaneously reacted with the ar-diamine and with the appropriate monoamine $HNR^6R^7$. Also a mixture of ar-diamines can be simultaneously reacted with a mono- or poly-sulfochlorided nucleus, with or without such monoamine.

The symbols $R^6$ and $R^7$ denote radicals selected from the group given above for $R^6$ and $R^7$ of the —$SO_2NR^6R^7$ substituent of ar. The —$SO_2$—$NR^6R^7$ substituents of ar and of the phthalocyanine nucleus may be identical or different.

The following may be mentioned as mono-amines which can be used to provide the $$-SO_2-N\begin{matrix} R^6 \\ R^7 \end{matrix}$$

structure:

Ammonia, methylamine, dimethylamine, ethylamine, diethylamine, β-hydroxyethylamine, β-methoxyethylamine, bis-β-hydroxyethylamine, aminoacetic acid, taurine, N-methyltaurine, butylamine, caprylamine, laurylamine, aniline, toluidine, chloroaniline, aniline-o-, -m- or p-sulphonic acid, aniline-o-, -m- or -p-carboxylic acid, N-methylaniline, N-ethylaniline-o-, -m- or -p-sulphonic acid, aniline-ω-methanesulphonic acid, benzylamine, N-β-hydroxyethyl-benzylamine, benzylamine-sulphonic acid and β-acetylaminoethylamine. Besides the groups $$-SO_2-\underset{\substack{| \\ R}}{N}-ar-NH_2$$

and eventually $$-SO_2-N\begin{matrix} R^6 \\ R^7 \end{matrix}$$

the phthalocyanine nucleus may contain sulfo groups which may be present in the starting material along with the sulfonylhalide groups or may be obtained by hydrolysis of a sulfonylhalide group.

If the number of

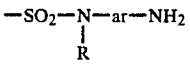

groups of the phthalocyanine nucleus is designated m, the number of

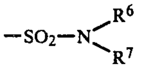

groups l and that of sulfo groups k, then generally the sum of k, l and m is 3 or 4, k being 1, 2 or 3, l being 0, 1 or 2 and m 1, 2, 3, or 4.

Preferably, l is 0, k is 2 or 3, m is 1 or 2 and k+m equals 3 or 4.

The cyclization of the hydrazone to give the pyrazole of formula III is carried out extremely easily as by stirring an aqueous solution of the hydrazone at temperatures between 0° and 100° C., preferably 15° to 30° C., at a pH between 8 and 14, for about 2 to about 20 hours to cause the splitting off of the alcohol $R^1OH$. The cyclization can be combined with a saponification of the group —$COOR^2$ to produce a pyrazole having the free carboxyl group. To achieve this it is only necessary to carry out the reaction near to the upper limit of the range of pH values indicated, for example at pH values from 10 to 14. The cyclization can also be appropriately carried out on the reaction mixture in which the hydrazones are formed, as by increasing its pH value to 10 to 14 and permitting the thus alkalized mixture to stand, with or without stirring, room temperature being sufficient.

As pointed out above, the coupling of a fiber-reactive group to the pyrazoles of formula III, is known in the art. For such coupling the pyrazoles can be reacted with the diazonium compound of an amine carrying the desired fiber-reactive group Z, such as

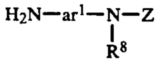

which readily and cleanly couples to the pyrazolone ring. If desired, the pyrazolone reactant need not be separated from the solution in which it is formed before subjecting it to this coupling reaction. The coupling takes place at temperatures between −5° and +35° C., preferably +5° to +20° C., and the coupling reaction mixture is subsequently stirred, if necessary with cooling, at temperatures between −5° and +25° C., preferably +5° to +15° C., until the coupling reaction has ended. During the course of the coupling reaction, which generally only takes a few minutes, the pH value is kept at values from 3 to 8, preferably 5 to 6, by the successive addition of a buffer or an alkali.

Fiber-reactive groups Z are those which contain a radical which can be split off as an anion or as a neutral radical or contain an activated double bond which is capable of addition reactions, and which are thus able of reacting with the hydroxyl groups of cellulose when the dyes are applied to cellulose materials in the presence of acid-binding agents and/or under the action of heat, or, when applied to high-molecular weight polyamide fibers, such as wool, reacting with the nucleophilic centers of these fibers with the formation of covalent bonds. Radicals which can be split off by nucleophilic attack are those which, because of their position in the periodic system and/or because of a positive charge center, are strongly electron-attracting. Activated double bonds are, for example, those which are conjugated with a polar double bond, for example a carbonyl group. A large number of fiber-reactive groupings of this type are known from the literature.

A survey of this subject is given in "K. Venkataraman The Chemistry of Synthetic Dyes", Vol. VI, pages 4 to 182, Academic Press (1972).

Examples of specific groups suitable to stand for Z in the dyestuffs of the present invention and described in greater detail in the above cited literature are radicals of $\alpha, \beta$-unsaturated acids, radicals of acids which contain a substituent which can be easily replaced nucleophilically, or which gives radicals of $\alpha, \beta$-unsaturated acids when a neutral or anionic group is split off, or which contain a vinylsulphone or $\beta$-halogenoalkyl or $\beta$-sulphatoalkylsulphone group, radicals of heterocyclic carboxylic or sulphonic acids which carry a substituent which is easily replaced during the course of the application by the radical of cellulose or by a nucleophilic group of the wool or the polyamide, such as, for example, the radicals of 2,3-dichloroquinoxaline-5- or -6-sulphonic acid, 2,3-dichloroquinoxaline-5- or -6-carboxylic acid, radicals of six-membered heterocyclic compounds containing 2 or 3 N atoms, such as s-triazinyl and pyrimidinyl radicals, which carry on at least one of the remaining positions at least one substituent which can be easily nucleophilically replaced.

In cases where the pyrimidine ring or triazine ring only carries one such labile substituent, this ring can carry one non-labile substituent on the remaining carbon atom or more non-labile substituents on remaining carbon atoms. A non-labile substituent is to be understood as a group which is bonded to a carbon atom of the triazine or pyrimidine ring by a covalent bond, this covalent bond not being broken open under the conditions used in applying the reactive dyestuff.

Examples of these non-labile substituents which may be mentioned are the amino group and mono-substituted or di-substituted amino groups and etherified hydroxyl and mercapto groups.

A well-known reactive group having besides one labile substituent one non-labile substituent is, e.g. the group

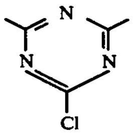

A large number of groups of this type are described in the above cited literature and in patent application, e.g. in German Patent application laid open to public inspection (Offenlegungsschrift)No. 2,152,511 and in "Venkataraman, The Chemistry of Synthetic Dyes", Vol. VI, p. 130–155, (1972).

A further known class of reactive groups derived from this last mentioned reactive group is characterized in that it has a second reactive group linked to the non-labile substituent of the first reactive group. One Example of this type of double-reactive groups has the formula

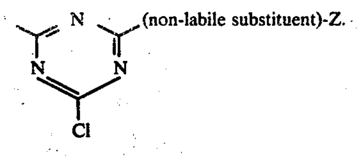

Reactive groups of this type are described in greater detail in German patent application laid open to public inspection (Offenlegungsschrift)Nos. 1,910,044, 2,101,940 and 2,109,879.

In the formula $H_2N—ar^1—NR^8Z$ the radical $ar^1$ stands for the same types of groups as ar, but having the nitrogen to be diazotized carried by a benzene ring, $R^8$ denotes hydrogen or alkyl having 1 to 4 carbons.

Typical reactive-group-supplying reactants are:

| | Z | X |
|---|---|---|
| 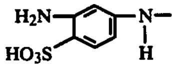 | 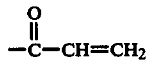 | |
| 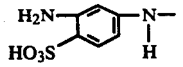 | 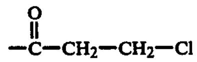 | |
| 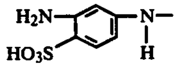 | 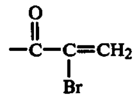 | |
| 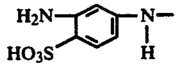 | 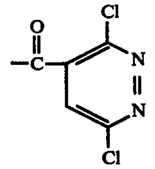 | |
| 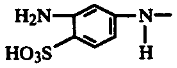 | 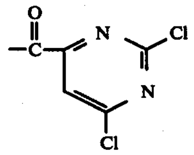 | |
| 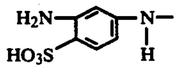 | 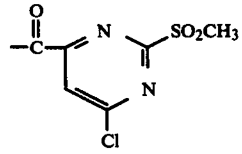 | |
| 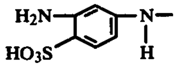 | 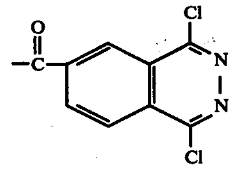 | |
| 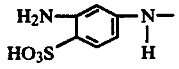 | 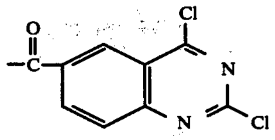 | |
| 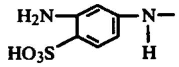 | 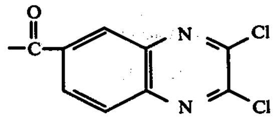 | |

-continued
| | Z | X |
|---|---|---|
| 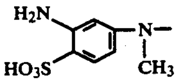 | 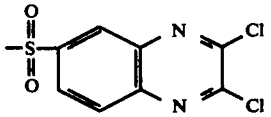 | |
| 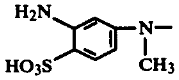 | 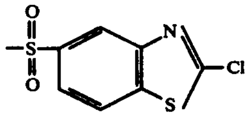 | |
| 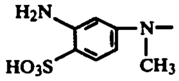 | 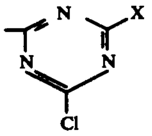 | Cl |
| 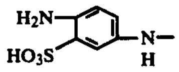 | 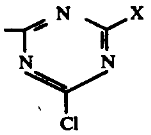 | Cl |
|  | 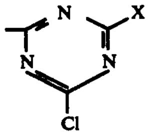 | Cl |
| 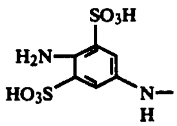 | 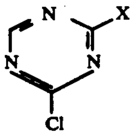 | Cl |
| 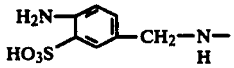 | 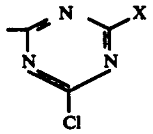 | Cl |
| 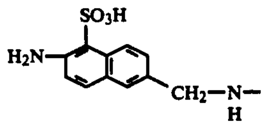 | 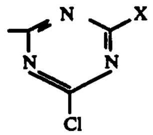 | Cl |
| 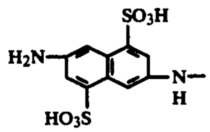 | 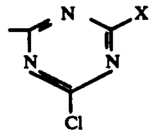 | Cl |
| 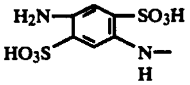 | 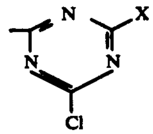 | Cl |
| 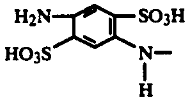 | 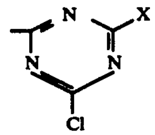 | $-NH_2$ |
| 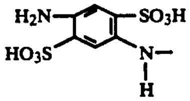 | 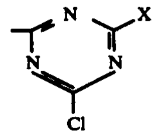 | 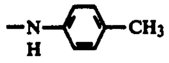 |
| 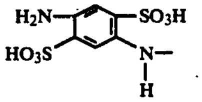 | 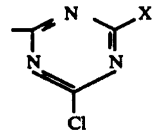 | 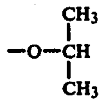 |

-continued
| | Z | X |
|---|---|---|
| 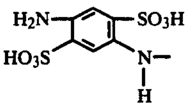 | 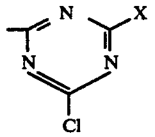 | $—O—CH_2—CH_2—O—CH_3$ |
| 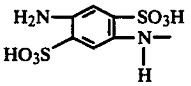 | 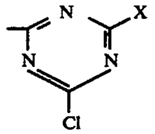 | 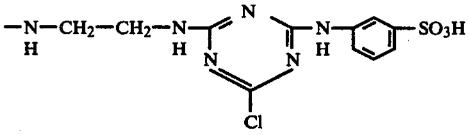 |
| 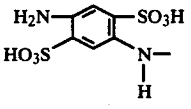 | 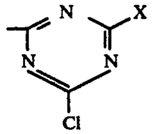 | 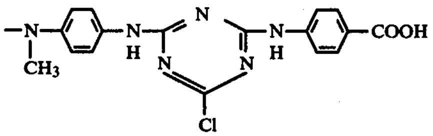 |
| 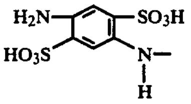 | 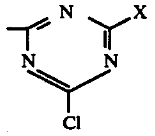 | 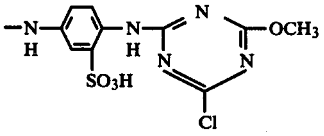 |
| 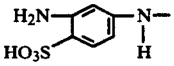 | 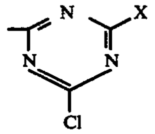 | 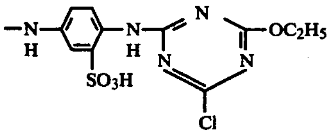 |
| 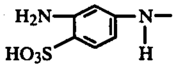 | 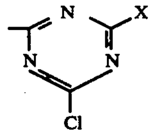 | Cl |
| 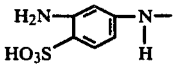 | 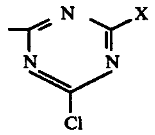 | 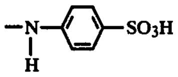 |
| 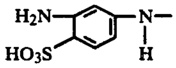 | 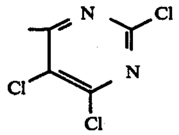 | |
| 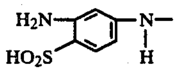 | 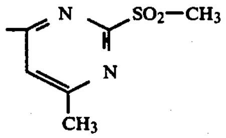 | |
| 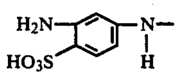 | 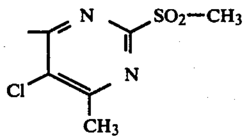 | |
| 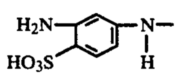 | 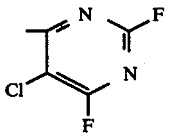 | |
| 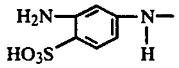 | 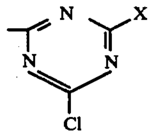 | 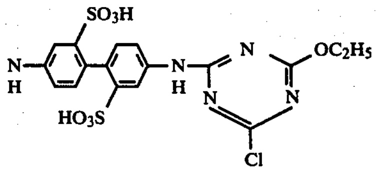 |

-continued

| | Z | X |
|---|---|---|
| 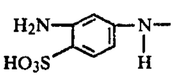 | 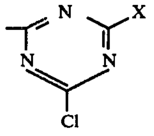 | 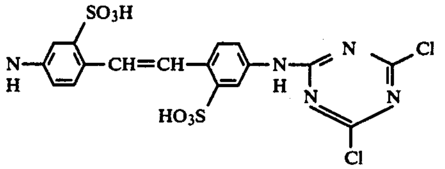 |

Diazocomponents of the formula

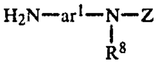

are prepared by known per se processes, e.g. by acylating aromatic diamines $H_2N$-ar$^1$-$NHR^8$ with halides of the formula hal-Z.

A large number of acylating agents of the formula hal-Z can be reacted with ar$^1$-diamines to give the diazotizable fiber-reactive-group-supplying reactant.

The most important ones are: cyanuric chloride and cyanuric bromide, dihalogeno-mono-amino-triazines, it being possible for the amino group as the non-reactive substituent to be substituted analogously to the equation described above, such as 2,6-dichloro-4-amino-triazine, 2,6-dichloro-4-methylamino-triazine, 2,6-dichloro-4-hydroxyethylaminotriazine, 2,6-dichloro-4-phenylaminotriazine, 2,6-dichloro-4-(o-, m- or p-sulphophenyl)-aminotriazine or 2,6-dichloro-4-(2',4'- or 2',5'-disulphohenyl)-aminotriazine, dihalogeno-alkoxy-sym.-triazines and dihalogeno-aryloxy-sym.-triazines, such as 2,6-dichloro-4-methoxytriazine, 2,6-dichloro-4-i-propoxytriazine, or 2,6-dichloro-4-phenoxytriazine, tetrahalogenopyrimidines, such as tetrachloro-, tetrabromo- or tetrafluoro pyrimidine, 2,4,6-trihalogenopyrimidines, such as 2,4,6-trichloropyrimidine, 2,4,6-tribromopyrimidine or 2,4,6-trifluoropyrimidine, 2,4,6-trichloro-5-nitropyrimidine, 2,4,6-trichloro-5-methylpyrimidine, 2,4,6-trichloro-5-carbomethoxypyrimidine or 2,4,6-trichloro-5-cyanopyrimidine or 2,6-difluoro-4-methyl-5-chloropyrimidine, 2,4-difluoro-pyrimidine-5-ethylsulphone, 2,6-difluoro-4-chloropyrimidine, 2,4,6-trifluoro-5-chloropyrimidine, 4,6-difluoro-2,5-dichloropyrimidine or 4,6-difluoro-2,5-dibromopyrimidine, 2-methylsulphonyl-4-chloro-6-methylpyrimidine, 2,6-bis-methylsulphonyl-4,5-dichloropyrimidine, 2-methylsulphonyl-4,5-dichloro-6-methylpyrimidine, 2-ethylsulphonyl-4,6-dichloropyrimidine, derivatives of heterocyclic carboxylic or sulphonic acids, such as 3,6-dichloropyridazine-4-carboxylic acid chloride, 2,4-dichloropyrimidine-5-carboxylic acid chloride, 2,4,6-trichloropyrimidine-5-carboxylic acid chloride, 2-methyl-4-chloropyrimidine-5-carboxylic acid chloride, 2-chloro-4-methylpyrimidine-5-carboxylic acid chloride, 2,6-dichloropyrimidine-4-carboxylic acid chloride, 2-methylsulphonyl-6-chloropyrimidine-4-carboxylic acid chloride or 2-methyl-sulphonyl-6-chloropyrimidine-5-carboxylic acid chloride, 2-ethylsulphonyl-6-chloropyrimidine-4-carboxylic acid chloride or 2-ethylsulphonyl-6-chloropyrimidine-5-carboxylic acid chloride, 2,6-bis-(methylsulphonyl)-pyrimidine-4-carboxylic acid chloride, 2-methylsulphonyl-6-methyl-4-chloropyrimidine-5-carboxylic acid chloride or bromide or 2-methylsulphonyl-6-methyl-4-bromopyrimidine-5-carboxylic acid chloride or bromide, 2,6-bis-(methylsulphonyl)-4-chloropyrimidine-5-carboxylic acid chloride, 2- or 3-monochloroquinoxaline-6-carboxylic acid chloride or 2- or 3-monochloroquinoxaline-6-sulphonic acid chloride, 2- or 3-monobromoquinoxaline-6-carboxylic acid bromide or 2- or 3-monobromoquinoxaline-6-sulphonic acid bromide, 2,3-dichloroquinoxaline-6-carboxylic acid chloride or 2,3-dichloroquinoxaline-6-sulphonic acid chloride, 2,3-dibromoquinoxaline-6-carboxylic acid bromide or 2,3-dibromoquinoxaline-6-sulphonic acid bromide, 1,4-dichlorophthalazine-6-carboxylic acid chloride or 1,4-dichlorophthalazine-6-sulphonic acid chloride and the corresponding bromine compounds, 2,4-dichloroquinazoline-6-carboxylic acid chloride, 2,4-dichloroquinazoline-7-carboxylic acid chloride or 2,4-dichloroquinazoline-6-sulphonic acid chloride or 2,4-dichloroquinazoline-7-sulphonic acid chloride and the corresponding bromine compounds, N-methyl-N-(2,4-dichlorotriazinyl-6)-aminoacetyl chloride, 2-chlorobenzthiazole-5-carboxylic acid chloride or 2-chlorobenzthiazole-6-carboxylic acid chloride or 2-chlorobenzthiazole-5-sulphonic acid chloride or 2-chlorobenzthiazole-6-sulphonic acid chloride and the corresponding bromine compounds, 2-methylsulphonyl- or 2-ethylsulphonyl- or 2-phenylsulphonyl-benzthiazole-5-sulphonic acid chloride or 2-methylsulphonyl- or 2-ethylsulphonyl- or 2-phenylsulphonylbenzthiazole-6-sulphonic acid chloride or aliphatic reactants, such as acrylic acid chloride, mono-, di- or trichloroacrylic acid chloride, 3-chloropropionic acid chloride, 3-phenylsulphonyl-propionic acid chloride, 3-methylsulphonyl-propionic acid chloride, 3-ethylsulphonyl-propionic acid chloride, 3-chloroethane-sulphochloride, α-methylsulphonylacrylic acid chloride and α-bromoacrylic acid chloride.

The acylation by these compounds is carried out in a manner which is in itself knwon in an aqueous, aqueous-organic or organic solvent by means of a Schotten-Baumann reaction at temperatures between 0° and 80° C., preferably between 10° and 25° C., the acid liberated appropriately being neutralized or buffered off by adding alkali, such as for example sodium bicarbonate, sodium carbonate, sodium hydroxide solution or sodium acetate. Possible organic solvents are acetone, chlorinated hydrocarbons, such as ethylene chloride or chlorobenzene, or also aprotic polar solvents, such as dimethylformamide.

The preparation of the above mentioned reactive ar[1] diamines is described in greater detail in "Venkataraman, The Chemistry of Synthetic Dyes" Vol. VI, pages 211 to 296 (1972) and in several patents and publications cited therein.

Other knowwn valuable fiber-reactive groups are the vinyl sulfonylgroup and β-substituted ethylsulfonyl groups, whose β-substituent is easy to split off together with an alpha hydrogen of the ethyl group in the alkaline pH range.

Very suitable reactive groups of this type are β-chloro-ethylsulfonyl, β-sulfatoethylsulfonyl and β-hydroxyethylsulfonyl; most preferred is β-sulfatoethylsulfonyl.

This type of reactive groups is described in greater details in "Venkataraman, The Chemistry of Synthetic Dyes", Vol. VI. pages 4 to 85 (1972).

This type of reactive groups can be introduced into the phthalocyanine pyrazolone by coupling it with diazotized amines having the formula

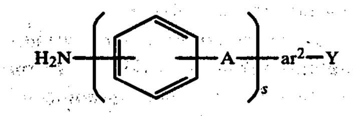

wherein Y is a fibre reactive group of the vinyl sulfonyl or β-substituted ethylsulfonyl type, $ar^2$ stands for the same types of groups as ar having the

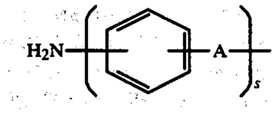

substituent carried by a benzene ring, A denotes a group —NH—CO— or —NH—$SO_2$— and s stands for 0 or 1.

Diazotization and coupling of the diazonium compound is carried out under the same conditions as described above in respect of the diazotization and coupling of amines of the formula

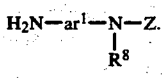

The dyestuff can then be isolated by salting-out, from the aqueous solutions of the phthalocyanine azo dyestuffs obtained in this way, or it can be obtained in the form of a solid dyestuff preparation by spray-drying the solutions.

The water-soluble, fibre-reactive phthalocyanine dyestuffs which can be manufactured according to the invention are outstandingly suitable for dyeing and printing cellulose materials, cellulose-containing materials and natural and synthetic polyamide materials. They are distinguished by a high degree of fixation, particularly in printing processes and in fixing by means of dry heat, and by ease of washing-out the non-fixed portion of dyestuff and they give yellowish-tinged to bluish-tinged green dyeings and prints of high brilliance and depth of colour which have very good fastness to light, good fastness to wet processing, such as washing at 60° C. and 95° C., fastness to sea water, fastenss to acid and alkaline perspiration, fastness to chlorinated pool water, fastness to peroxides and fastness to flue gases.

Mixtures of dyestuffs which can be manufactured according to the invention, especially those in which the meanings of k and/or l and/or m are different in the individual components, are also outstandingly suitable for dyeing and printing cellulose materials and display the same advantageous properties as the individual dyestuffs.

EXAMPLE 1

188 g of m-phenylenediamine-sulphonic acid are dissolved in about 6,000 ml of water to give a neutral solution. 190 g of cyanuric chloride, dissolved in acetone, are added to this solution at 0°-5° C. and the pH is simultaneously kept between 6 and 7 with about 100 ml of 10 N sodium hydroxide solution. When no further m-phenylenediamine-sulphonic acid can be detected, 70 g of sodium nitrite are added to the neutral solution and the mixture is then stirred into 250 ml of 10 N hydrochloric acid at 0°-3° C. When the diazotisation ceases, the diazo suspension is added to a solution of N-[3-(3-carboxy-5-hydroxy-1-pyrazolyl)-4-sulpho-phenyl]-Ni-trisulpho-phthalocyaninylsulphonamide, to which 100 g of bicarbonate have previously been added. The coupling ceases in a few minutes.

The green phthalocyanine azo dyestuff formed can be isolated by salting out or spray-drying.

The solution of the phthalocyaninepyrazolone, required for the coupling reaction, can be obtained in the following manner:

1,060 g of 3-(3-amino-4-sulpho-phenyl)-amino-sulphonylnickel-phthalocyanine-3′,3″, 3‴-trisulphonic acid, manufactured in the customary manner by condensation reaction of nickel phthalocyanine sulphochloride with 1,3-diaminobenzene-4-sulphonic acid, are stirred with 7,000 ml of water and dissolved by adding 400 ml of 10 N sodium hydroxide solution. 72 g of sodium nitrite are added to this solution and the mixture is then stirred into a mixture of 2,000 g of ice and 300 ml of concentrated hydrochloric acid in the course of 30 minutes. A temperature of 0° to 5° C. is maintained by adding a further 2,000 g of ice. After a short time, any possible excess of nitrite is decomposed by adding aminosulphonic acid. 21 g of acetylsuccinic acid dimethyl ester are poured into the diazo suspension thus obtained. The pH value is subsequently initially kept at 5.5 by sprinkling in approximately 13 g of sodium carbonate, and then at 5 to 6 with approximately 21 g of sodium bicarbonate. The mixture is subsequently stirred for approximately 1 hour. The end of the reaction can be recognised as being when the pH remains constant and when no change in shade occurs if a solution of H-acid in 2 N sodium carbonate is added to a sample.

350 ml of 10 N hydroxide solution are added to the solution thus obtained of [3-(nickel-trisulphophthalocyaninylsulphonylamino)]-6-sulpho-phenylhydrazone of oxalacetic acid dimethyl ester, whereby the pH rises to values of 12 to 13. The mixture is stirred for several hours, preferably overnight, at room temperature. The rearrangement to give N-[3-(3-carboxy-5-hydroxy-1-pyrazolyl)-4-sulpho-phenyl]-nickel-trisulpho-phthalocyaninyl-sulphonamide is then complete; the pH is adjusted back to 8 with a little hydrochloric acid and the resulting crude solution is employed direct in the coupling reaction.

If the cyanuric chloride is replaced by an equi-molar amount of one of the acylating agents in the following and the procedure followed is otherwise as described above, valuable green reactive dyes are likewise obtained:

2,4,6-trisulpho-1,3,5-triazine, β-chloropropionic acid chloride, α,β-dibromopropionic acid chloride, β-phenylsulphonylpropionic acid chloride, β-pyridinium-propionic acid chloride, β-sulphatopropionic acid chloride, acrylic acid chloride, α-bromoacrylic acid chloride, 3-β-chloroethylsulphonylbenzoic acid chloride, 4-vinylsulphonylcyclohexanecarboxylic acid chloride, 4-β-chloroethylsulphonyl-2,5-endomethylene-cyclohexanecarboxylic acid chloride, ω-(β-chloroethylsulphonyl)-butyric acid chloride, 2,4-dichloropyrimidine-5-carboxylic acid chloride, 2,4-dibromo-pyrimidine-5-carboxylic acid bromide, 2,4-difluoro-pyrimidine-5-carboxylic acid chloride, 2,6-dichloro-pyrimidine-4-carboxylic acid chloride, 2,3-dichloroquinoxaline-6-carboxylic acid chloride, 2,3-dichloroquinoxaline-6-sulphonic acid chloride, 1,4-dichloro-phthalazine-6-sulphonic acid chloride, 1,4-dichlorophthalazine-6-carboxylic acid chloride, 2-methylsulphonyl-6-chloro-pyrimidine-4-carboxylic acid chloride, 3,6-dichloro-pyridazine-4-carboxylic acid chloride, 2-methylsulphonyl-6-chloro-pyrimidine-5-carboxylic acid chloride and 2,6-bis-(methylsulphonyl)-pyrimidine-5-carboxylic acid chloride.

If the condensation product of nickel phthalocyanine sulphochloride and one of the following amines is used instead of the similar condensation product of Example 1, valuable green reactive dyestuffs are likewise obtained: 1,4-phenylenediamine-2-sulphonic acid, 1,3-phenylenediamine-4,6-disulphonic acid, 1,4-phenylenediamine-2,5-disulphonic acid, 1,4-phenylenediamine-2,6-disulphonic acid, 2,4-diaminotoluene-6-sulphonic acid, 2,6-diaminotoluene-4-sulphonic acid, 2,4-diamino-1,3,5-trimethylbenzene-6-sulphonic acid, 2,6-diaminonaphthalene-4,8-disulphonic acid, 1,5-diaminonaphthalene-2-sulphonic acid, 2,6-diaminonaphthalene-8-sulphonic acid, 1-amino-4-aminomethyl-benzene-3-sulphonic acid, 2-amino-5-aminomethyl-naphthalene-1-sulphonic acid, 4,4'-diamino-diphenylamine-3-sulphonic acid, 3,3'-diamino-4-methyl-diphenylsulphone-5-sulphonic acid, 1,3-phenylenediamine (acetyl derivative, subsequently saponified), 2,4-diaminotoluene (acetyl derivative, subsequently saponified), 1,4-phenylenediamine (acetyl derivative, subsequently saponified), 4,4'-diamino-diphenylethane-2-2'-disulphonic acid, 4,4'-diamino-diphenylethane-mono-sulphamide, 4,4'-diamino-diphenylethane-disulphamide, 4,4'-diaminostilbene-2-2'-disulphonic acid, 4,4'-diamino-diphenylethane-di-β-hydroxyethyl-sulphamide, 4,4'-diamino-diphenylamine-3-sulphonic acid, 3,4'-diamino-6-methoxy-diphenylamine-2'-sulphonic acid, 3-4'-diamino-4-methyl-diphenylamine-2'-sulphonic acid, 3,3'-diaminobenzophenone-5-5'-disulphonic acid, 3,4'-diaminobenzophenone-3'-sulphonic acid, 4,4'-diamino-diphenylsulphone, 4,4'-dichloro-3,3'-diamino-diphenylsulphone, 3,3'-diamino-4-methyl-diphenylsulphone-5-sulphonic acid and 3,3'-diamino-diphenylsulphonic-4-4'-disulphonic acid.

EXAMPLE 2

268 g of p-phenylenediamine-2,6-disulphonic acid are reacted in the customary manner with 183 g of methoxy-dichlorotriazine. After adding 70 g of sodium nitrite, the solution of the resulting condensation product is allowed to run into 250 ml of 10 N hydrochloric acid, and the diazo suspension thus obtained is subsequently added, as described in Example 1, to a solution of bispyrazolone manufactured as described below from 535 g of 3,3'-bis-[(4-aminophenyl)-aminosulphonyl]-nickel-phthalocyanine-3'',3'''-disulphonic acid. The pH is subsequently adjusted to 7–7.2 with 4 N sodium carbonate solution and the green dyestuff formed is isolated by salting out or spray-drying.

The bispyrazolone employed as the coupling component was manufactured in the following manner:

535 g of 3,3'-bis/(4-aminophenyl)-amino-sulphonyl)-nickel-phthalocyanine-3'',3'''-disulphonic acid, manufactured in the customary manner by condensation of 0.5 mol of nickel phthalocyanine tetrasulphochloride with 1 mol of acetyl-p-phenylenediamine and saponification of the condensation product, are stirred with 3,500 ml of water and dissolved by adding 200 ml of 10 N sodium hydroxide solution. 70 g of sodium nitrite are added to this solution and the mixture is then stirred into a mixture of 2,000 g of ice and 300 ml of concentrated hydrochloric acid in the course of about 30 minutes. The temperature is kept between 0° and 5° C. by adding a further 100 g of ice. The mixture is subsequently stirred for about 10 minutes and any possible slight excess of nitrite is then removed with aminosulphonic acid. 135 g of acetylsuccinic acid diethyl ester are added to the diazo suspension thus obtained. The pH is adjusted to about 6 with approximately 250 g of sodium carbonate and kept at this value until no further diazo compound can be detected. A solution of turquoise-coloured 3,3'-bis-[4-(1,2-bis-ethoxycarbonyl-ethylidene)-hydrazino-phenyl-amino-sulphonyl-]nickelphthalocyanine-3'',3'''-disulphonic acid is thus obtained, which is converted direct to the corresponding bispyrazolone by the action of alkali by adding about 400 ml of 10 N sodium hydroxide solution and stirring the mixture at room temperature for approximately 4 hours.

In the corresponding 4,4',4'',4'''-derivative is used instead of the amine employed above, valuable phthalocyanine hydrazones are likewise obtained.

If the condensation product of nickel phthalocyanine sulphochloride and two mols of one of the following ar-diamines is used as the diazo component for the pyrazolone step instead of the ar-diamine employed above and the procedure followed is otherwise as described above, green phthalocyanine azo dyes are likewise obtained. 1,3-phenylenediamine (acetyl derivative, subsequently saponified), 2,4-diaminotoluene (acetyl derivative, subsequently saponified), 2,4-diaminoanisole (acetyl derivative, subsequently saponified), 1,4-phenylenediamine-2-sulphonic acid, 2,4-diamino-toluene-6-sulphonic acid, 4-amino-benzylamine (4-acetyl derivative, subsequently saponified), 4,4'-diaminostilbenedisulphonic acid, 4,4'-diaminomethanesulphonic acid or 4,4'-diamino-diphenylamine-3-sulphonic acid.

In the acetylsuccinic acid diethyl ester employed as the coupling component for the pyrazolone step is replaced by one of the following derivatives of succinic acid, arylhydrazones which can be processed according to the invention to give valuable azo phthalocyanine dyes are likewise obtained.

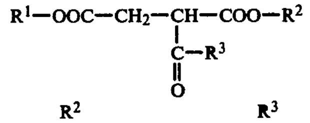

| $R^1$ | $R^2$ | $R^3$ |
|---|---|---|
| $-CH_3$ | $-CH_3$ | $-H$ |
| $-CH_3$ | $-C_2H_4Cl$ | $-CH_3$ |
| $-CH_3$ | $-i-C_3H_4$ | $-CH_3$ |
| $-CH_3$ | $-i-C_4H_9$ | $-COO-CH_3$ |
| $-CH_3$ | $-i-C_6H_{11}$ | $-COO-C_2H_5$ |
| $-CH_3$ | $-C_2H_4-OH$ | $-CH_3$ |
| $-CH_3$ | $-C_3H_6-OCH_3$ | $-COO-C_3H_4$ |
| $-CH_3$ | $-C_2H_5$ | $-COO-C_3H_4$ |
| $-C_3H_7$ | $-C_2H_5$ | $-C_3H_7$ |
| $-C_5H_{11}$ | $-C_2H_5$ | $-CH_2-C_6H_5$ |
| $-C_9H_{19}$ | $-C_2H_5$ | $-COO-CH_3$ |
| $-C_{16}H_{33}$ | $-C_2H_5$ | $-C_6H_5$ |
| $-C_2H_4-O-C_2H_5$ | $-C_2H_5$ | $-C_6H_4-CH_3$ |

If the methoxydichlorotriazine is replaced by one of the following reactive components mentioned during the acylation of p-phenylenediamine-2,6-disulphonic acid, soluble fiber-reactive dyes are likewise obtained. 2-amino-4,6-dichloro-1,3,5-triazine, 2-phenoxy-4,6-dichloro-1,3,5-triazine, 2-phenylamino-4,6-dichloro-1,3,5-triazine, 2-N-methyl-N-phenylamino-4,6-dichloro-1,3,5-triazine, 2-butylmercapto-4,6-dichloro-1,3,5-triazine, 2-β-methoxyethoxy-4,6-dichloro-1,3,5-triazine, 2-(2'-crboxyphenoxy)-4,6-dichloro-1,3,5-triazine, 2-carboxymethylthio-4,6-dichloro-1,3,5-triazine, 2-phenylthio-4,6-dichloro-1,3,5-triazine, condensation product of 1 mol of cyanuric chloride and 1 mol of 2-β-amino-ethylamino-4-(2',5'-disulphophenylamino)-6-chlorotriazine-1,3,5, condensation product of cyanuric chloride and 1 mol of 2,4'-amino-3'-sulpho-phenylamino-4-(2"-carboxyphenylamino)-6-chlorotriazine-1,3,5, condensation product of cyanuric chloride and 1 mol of 2-3'-amino-4'-sulpho-phenylamino-4-n-butoxy-6-chlorotriazine-1,3,5, 2,4-disulpho-6-chloro-1,3,5-triazine, tetrachloropyrimidine, 2,4,6-trichloropyrimidine, 5-cyano-2,4,6-trichloropyrimidine, 5-nitro-2,4,6-trichloropyrimidine, 2,4-difluoro-6-chloropyrimidine, 2-methylsulphonyl-4-methyl-6-chloropyrimidine, condensation product of cyanuric chloride and 2-methoxy-4-β-hydroxyethoxy-6-chloro-1,3,5-triazine, 2-methylsulphonyl-4,6-dichloropyrimidine, 2,3-dichloroquinoxyline-5-carboxylic acid chloride, 2,3-dichloroquinoxyline-6-carboxylic acid chloride, 2,3-dichloroquinoxaline-5-sulphonic acid chloride, 2,3-dichloroquinoxaline-6-sulphonic acid chloride, 2,4-dichloroquinazoline-6-carboxylic acid chloride, 2,4-dichloroquinazoline-6-sulphonic acid chloride, 2,4-dichloroquinazoline-7-sulphonic acid chloride, 1,4-dichlorophthalazine-6-carboxylic acid chloride, 3,6-dichloropyridazine-4-carboxylic acid chloride, 2,4-dichloropyrimidine-5-carboxylic acid chloride or 2,4-difluoropyrimidine-6-carboxylic acid chloride.

EXAMPLE 3

If the sulfonamides in the following tables are substituted for the sulfonamide in Example 1, that is to say 3-[(3-amino-4-sulpho-phenyl)-amino-sulphonyl-]-nickel-phthalocyanine-3',3",3'"-trisulphonic acid, and the procedure followed is otherwise unchanged, there are obtained valuable hydrazones of oxalacetic acid methyl ester which can be further processed to correspondingly substituted pyrazoles to make fiber-reactive dyes in accordance with the present invention:

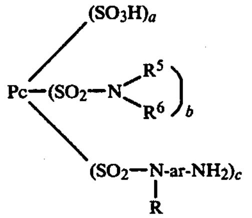

where Pc is the phthalocyanine dye nucleus.

| $R^5$ | $R^6$ | R | ar | a | b | c |
|---|---|---|---|---|---|---|
| $-H$ | $-CH_3$ | H | 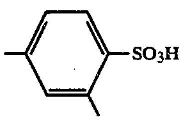 | 2 | 1 | 1 |
| $-H$ | $-CH_2-COOH$ | H | 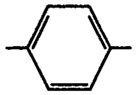 | 2 | 1 | 1 |
| $-H$ | $-C_2H_4-SO_3H$ | $CH_3$ | 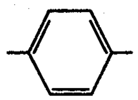 | 1 | 1 | 2 |

-continued
| $R^5$ | $R^6$ | R | ar | a | b | c |
|---|---|---|---|---|---|---|
| —H | $-C_2H_4Cl$ | H | 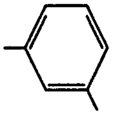 | 2 | 1 | 1 |
| —H | $-C_2H_4OH$ | $C_2H_5$ | 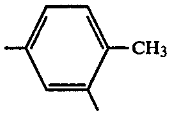 | 2 | 1 | 1 |
| —H | $-C_2H_4-O-C_2H_5$ | $C_2H_5$ | 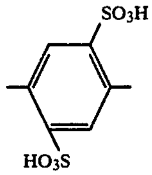 | 2 | 1 | 1 |
| —H | $-C_4H_8-NH-COCH_3$ | H | 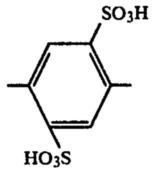 | 2 | 1 | 1 |
| —H | $-C_6H_{10}-NH-COC_6H_5$ | H | 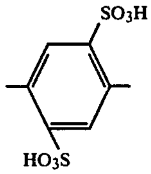 | 2 | 1 | 1 |
| —H | $-C_2H_4-SO_3H$ | $-C_2H_4-O-C_2H_5$ | 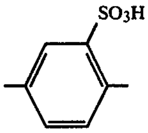 | 2 | 1 | 1 |
| —H | $-C_3H_6-COOH$ | $-C_6H_{12}\underset{H}{N}-\underset{\underset{O}{\|}}{C}-CH_3$ | 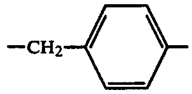 | 2 | 1 | 1 |
| —H | $-C_6H_{13}$ | H | 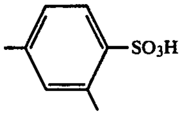 | 2 | 1 | 1 |
| —H | $-C_9H_{19}$ | H | 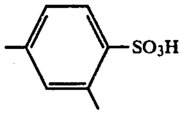 | 2 | 1 | 1 |
| —H | $-C_{15}H_{31}$ | $-C_4H_9$ | 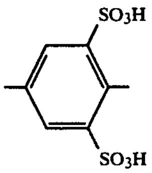 | 2 | 1 | 1 |
| —H | $-C_{20}H_{41}$ | H | 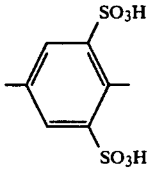 | 2 | 1 | 1 |

-continued
| $R^5$ | $R^6$ | R | ar | a | b | c |
|---|---|---|---|---|---|---|
| $-H$ | $-C_4H_9$ | H | 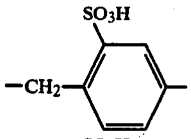 | 2 | 1 | 1 |
| $-H$ | $-C_3H_7$ | H | 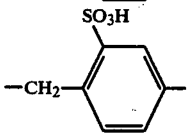 | 2 | 1 | 1 |
| $-H$ | $-C_2H_5$ | H | 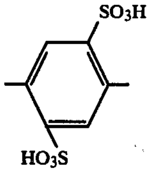 | 2 | 1 | 1 |
| $-CH_3$ | $-C_2H_5$ | H | 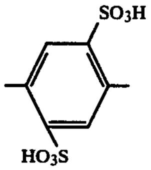 | 2 | 1 | 1 |
| $-C_2H_5$ | $-C_2H_5$ | $CH_3$ | 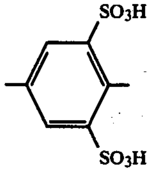 | 2 | 1 | 1 |
| $-C_3H_7$ | $-C_2H_5$ | $-CH_2-SO_3H$ | 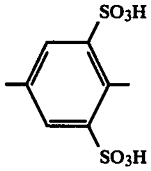 | 2 | 1 | 1 |
| $-C_2H_4Br$ | $-C_2H_5$ | $-CH_2-SO_3H$ | 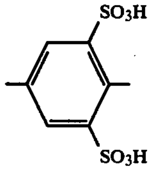 | 2 | 1 | 1 |
| $-C_2H_4-O-CH_3$ | $-C_2H_5$ | $-CH_2CH_2-COOH$ | 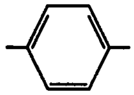 | 2 | 1 | 1 |
| $-C_2H_4-SO_3H$ | $-C_2H_5$ | $-CH_2CH_2-COOH$ | 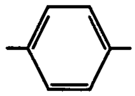 | 2 | 1 | 1 |
| $-C_4-H_8-COOH$ | $-C_2H_5$ | $-CH_3$ | 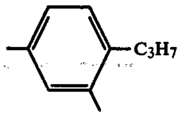 | 2 | 1 | 1 |
| $-C_2H_4OH$ | $-C_2H_5$ | $-CH_3$ | 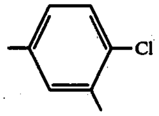 | 2 | 1 | 1 |
| $-C_2H_4OH$ | $-C_2H_4OH$ | $-CH_3$ | 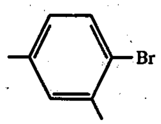 | 2 | 1 | 1 |

-continued

| $R^5$ | $R^6$ | R | ar | a | b | c |
|---|---|---|---|---|---|---|
| $-C_2H_4OH$ | $-C_2H_4OH$ | H | 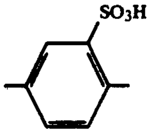 | 1 | 1 | 1 |
| $-C_2H_4OH$ | $-C_2H_4OH$ | H | 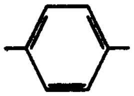 | 1 | 1 | 2 |
| H | $-C_2H_4-SO_3H$ | H | 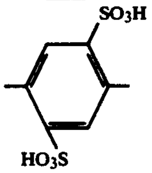 | 1 | 2 | 1 |
| H | $-C_2H_4-SO_3H$ | H | 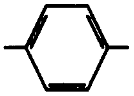 | 1 | 1 | 1 |
| H | $-C_2H_4OH$ | H | 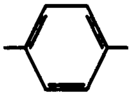 | 1 | 2 | 1 |
| | | H |  | 0 | 0 | 3 |
| | | $C_2H_5$ | 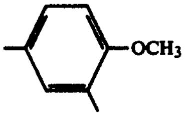 | 1 | 0 | 2 |
| H | $-CH_2-COOH$ | H | 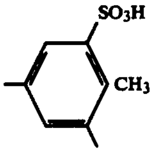 | 1 | 1 | 2 |
| | | H | 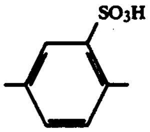 | 1 | 0 | 3 |
| | | H | 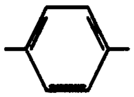 | 0 | 0 | 4 |
| | | H | 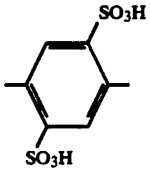 | 1 | 0 | 1 |

EXAMPLE 4

The diazonium compound that supplies the fiber-reactive group in Example 1, that is to say the cyanurylated metaphenylene diamine-sulphonic acid, is replaced by an equivalent amount of diazotized 2-amino-4-acetylamino-benzenesulphonic acid and the procedure followed is otherwise as described in Example 1.

200 ml of 10 N sodium hydroxide solution are subsequently added to the solution of the green azo phthalocyanine dye formed and the mixture is stirred for five hours at 95° until the acetyl group is completely saponified.

The dye solution thus obtained is neutralised with about 100 ml of 10 N hydrochloric acid and a solution of 190 g of cyanuric chloride in acetone is then added at 0°-5° C. The pH value is simultaneously kept between 5.0 and 6.5 by adding about 80 g of sodium bicarbonate in portions. The reaction has ended when no further amino groups which can be diazotised can be detected.

The fiber-reactive dye thus obtained is identical to that manufactured according to Example 1.

EXAMPLE 5

188 g of m-phenylenediamine-sulphonic acid are dissolved in about 6,000 ml of water to give a neutral solution. 190 g of cyanuric chloride, dissolved in acetone, are added to this solution at 0°-5° C. and the pH is simultaneously kept between 6 and 7 with about 100 ml of 10 N sodium hydroxide solution. When no further m-phenylenediamine-sulphonic acid can be detected, 70 g of sodium nitrite are added to the neutral solution and the mixture is then stirred into 250 ml of 10 N hydrochloric acid at 0°-3° C. When the diazotisation ceases, the diazo suspension is added to a solution of N-[3-(3-carboxy-5-hydroxy-1-pyrazolyl)-4-sulpho-phenyl]-Ni-trisulpho-phthalocyaninylsulphonamide, to which 100 g of bicarbonate have previously been added. The coupling ceases in a few minutes.

The green reactive phthalocyanineazo dye thus obtained has two labile chlorine substituents in the reactive moiety which has the formula

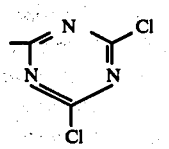

It can be modified by the following operation:

173 g aniline-4-sulfonic acid are dissolved in a mixture of 500 ml of water and 130 ml of 30% by weight of sodium hydroxide solution. The resulting solution is added to the green dyestuff solution and the mixture is then warmed, in each case for one hour, to 30° C., 40° C. and 50° C., the pH being kept between 4 and 7 by adding alkali, such as sodium hydrogencarbonate, sodium carbonate or sodium hydroxide solution.

The reactive moiety of the resulting dye has the formula

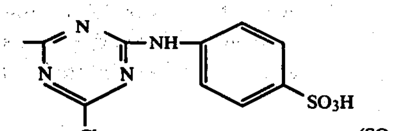

It has one labile chlorine substituent and one non-labile amine substituent.

The dye can be isolated by salting out or spray-drying. It has a very high degree of fixation on cellulose material particularly if fixing is performed by means of dry heat. The green dyeings have excellent fastness properties particularly to light, to washing at 60° C. and 95° C. and to perspiration.

If one mol of one of the following compounds is substituted for the aqueous solution of aniline-4-sulfonic acid used in this example, valuable green reactive dyestuffs are likewise obtained. In the case of ammonia or aliphatic amines, the alkali can be replaced by a second mol of amine. Ammonia, methylamine, diethylamine, isopropylamine, ethanolamine, diethanolamine, N,N-dimethylhydrazine, aniline, o-, m- or p-toluidine, N-methylaniline, aniline-2- or aniline-3-, sulphonic acid, 2-, 3- or 4-aminobenzoic acid, aniline-methanesulphonic acid, β-amino-ethanesulphonic acid, N-methyltaurine, aminoacetic acid, aniline-2,4- or aniline-2,5-disulphonic acid or the condensation product of: p-phenylenediamine, cyanuric chloride and aniline-3-sulphonic acid, ethylene diamine, cyanuric chloride and aniline-2,4-disulphonic acid, 1,4-phenylenediamine-2,5-disulphonic acid and iso-propoxydichlorotriazine, 1-3-phenylenediamine-4-sulphonic acid and β-ethoxyethoxydichlorotriazine, p-phenylenediaminesulphonic acid and cyanuric chloride, p-phenylenediaminesulphonic acid and tetrachloropyrimidine, p-phenylenediamine-sulphonic acid and 2,3-dichloroquinoxaline-carboxylic acid chloride, p-phenylenediaminesulphonic acid and 2,6-dichloropyrimidine-4-carboxylic acid chloride or p-phenylenediaminesulphonic acid and 3,6-dichloropyridazine-4-carboxylic acid chloride.

EXAMPLE 6

281 g of 4-aminophenyl-1-sulphatoethyl sulphone are dissolved in about 6,000 ml of water to form a neutral solution. 70 g of sodium nitrite are added to the neutral solution and the mixture is then stirred into 250 ml of 10 N hydrochloric acid at 0°-30° C. When the diazotisation is complete, the diazo suspension is added to a solution of N-[3'-(3-carboxy-5-hydroxy-1-pyrazolyl)-4'-sulpho-phenyl]-Ni-trisulpho-phthalocyaninylsulphonamide to which 100 g of sodium bicarbonate have previously been added. The coupling is complete within a few minutes.

The resulting green phthalocyanine azo dyestuff can be isolated by salting-out or spray-drying. It has the following structure:

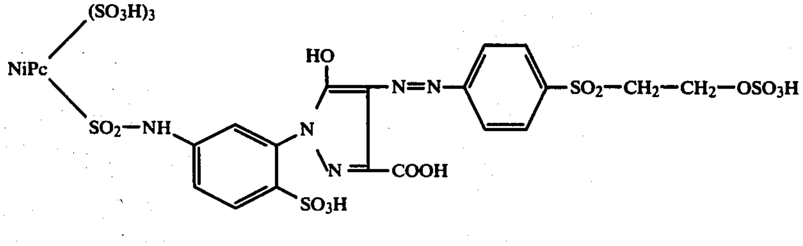

The solution of the phthalocyanine-pyrazolone which is required for the coupling can be obtained in the following manner: 1,060 g of 3-(3-amino-4-sulpho-phenyl)-amino-sulphonyl-nickelophthalocyanine-3',3'',3'''-trisulphonic acid, which has been prepared in the customary manner by a condensation reaction of nickel phthalocyanine sulphochloride with 1,3-diaminobenzene-4-sulphonic acid, are stirred with 7,000 ml of water and are dissolved by adding 400 ml of 10 N sodium hydroxide solution. 72 g of sodium nitrite are added to this solution and the mixture is then stirred into a mixture of 2,000 g of ice and 300 ml of concentrated hudrochloric acid in the course of 30 minutes. A temperature of 0° to 5° C. is maintained by adding a further 2,000 g of ice. After a short time any excess of nitrite which may be present is destroyed by adding aminosulphonic acid. 21 g of acetylsuccinic acid dimethyl ester are poured into the diazo suspension obtained in this way. The pH value is then kept, first at 5.5 by sprinkling in approximately 13 g of sodium carbonate, and then at 5 to 6 using approximately 21 g of sodium bicarbonate. Stirring is then continued for approximately 1 hour. The end of the reaction is recognised from the fact that the pH remains constant and that no alteration in colour shade occurs when a sample is treated with a solution of H acid in 2 N sodium carbonate.

350 ml of 10 N alkali metal hydroxide solution are added to the solution of oxalacetic acid dimethyl ester-3-(nickel-trisulpho-phthalocyaninylsulphonylamino)-6-sulphophenylhydrazone obtained in this way, as a result of which the pH rises to values of 12 to 13. The mixture is stirred for a few hours, best overnight at room temperature. The rearrangement to give N-[3-(3-carboxy-5-hydroxy-1-pyrazolyl)-4-sulpho-phenyl]-nickel-trisulpho-phthalocyaninyl-sulphonamide is then complete; the pH is reduced to 8 with a little hydrochloric acid and the resulting crude solution is employed direct for coupling.

Dyestuffs having similar properties are obtained if, instead of 4-aminophenyl-β-sulphatoethyl sulphone, equivalent quantities of the following amines are used: 3-aminophenyl-β-sulphatoethyl sulphone, 3-amino-4-methoxyphenyl-β-sulphatoethyl sulphone, 4-amino-3-methoxyphenyl-β-sulphatoethyl sulphone, 3-amino-4-methylphenyl-β-sulphatoethyl sulphone, 3-amino-4-sulphophenyl-β-sulphatoethyl sulphone, 4-amino-3-bromophenyl-β-sulphatoethyl sulphone, 4-amino-3,5-dichlorophenyl-β-sulphatoethyl sulphone, 3-amino-4-carboxyphenyl-β-sulphatoethyl sulphone, 3-amino-4-hydroxyphenyl-β-sulphatoethyl sulphone, 4-amino-3-hydroxyphenyl-β-sulphatoethyl sulphone, 4-amino-2,5-dimethoxyphenyl-β-sulphatoethyl sulphone, 4-amino-2-methyl-5-methoxyphenyl-β-sulphatoethyl sulphone, 4-amino-phenyl-β-(N,N-dimethylamino)-ethyl sulphone, 4-aminophenyl-β-(N,N-diethylamino)-ethyl sulphone, 4-aminophenyl-β-phosphatoethyl sulphone, 4-aminophenyl-β-thiosulphatoethyl sulphone, 4-aminophenyl-β-chloroethyl sulphone, 3-aminophenyl-β-chloroethyl sulphone, 4-aminophenyl-vinyl sulphone, 4-amino-3-chloro-5-methylphenyl-β-sulphatoethyl sulphone, 3-aminobenzyl-β-sulphatoethyl sulphone, β-(4-aminophenyl)-ethyl-β-sulphatoethyl sulphone, 3-nitro-4-(4'-aminophenyl)-aminophenyl-β-sulphatoethyl sulphone, 2-phenylamino-5-amino-phenyl-β-sulphatoethyl sulphone, 4-(4'-aminophenylsulphonyl)-phenyl-β-sulphatoethyl sulphone, 3-(4'-aminobenzyl)-amino-phenyl-β-sulphatoethyl sulphone, 3-(3'-aminophenylsulphonyl)-amino-phenyl-β-sulphatoethyl sulphone, 4-amino-1-naphthyl-β-sulphatoethyl sulphone, 5-amino-1-naphthyl-β-sulphatoethyl sulphone, 6-amino-1-naphthyl-β-sulphatoethyl sulphone, 6-amino-2-naphthyl-β-sulphatoethyl sulphone, 6-amino-1-sulpho-2-naphthyl-β-sulphatoethyl sulphone, 8-amino-2-naphthyl-β-sulphatoethyl sulphone and 8-amino-6-sulpho-2-naphthyl-β-sulphatoethyl sulphone.

Valuable green reactive dyestuffs are also obtained if the condensation product of nickel phthalocyanine sulphochloride and one of the amines mentioned in the following text is used for the preparation of the coupling component instead of the abovementioned condensation product of nickel phthalocyanine sulphochoride and 1,3-diaminobenzenesulphonic acid, and if the procedure followed is in other respects as described: 1,4-phenylenediamine-2-sulphonic acid, 1,3-phenylenediamine-4,6-disulphonic acid, 1,4-phenylenediamine-2,5-disulphonic acid, 1,4-phenylenediamine-2,6-disulphonic acid, 2,4-diaminotoluene-6-sulphonic acid, 2,6-diaminotoluene-4-sulphonic acid, 2,4 -diamino-1,3,5-trimethylbenzene-6-sulphonic acid, 2,6-diaminonaphthalene-4,8-disulphonic acid, 1,5-diaminonaphthaline-2-sulphonic acid, 2,6-diaminonaphthalene-8-sulphonic acid, 1-amino-4-aminomethyl-benzene-3-sulphonic acid, 2-amino-5-aminomethyl-naphthalene-1-sulphonic acid, 4,4'-diamino-diphenylamine-3-sulphonic acid, 3,3'-diamino-4-methyl-diphenyl-sulphone-5-sulphonic acid, 1,3-phenylenediamine (acetyl derivative, subsequently saponified), 2,4-diaminotoluene (acetyl derivative, subsequently saponified), 1,4-phenylenediamine (acetyl derivative, subsequently saponified), 4,4'-diamino-diphenylethane-2,2'-disulphonic acid, 4,4'-diamino-diphenylethane-mono-sulphamide, 4,4'-diamino-diphenylethane-disulphamide, 4,4'-diaminostilbene-2,2'-disulphonic acid, 4,4'-diamino-diphenylamine-3-sulphonic acid, 3,4'-diamino-6-methoxy-diphenylamine-2'-sulphonic acid, 3,4'-diamino-4-methyl-diphenylamine-2'-sulphonc acid, 3,3'-diaminobenzophenone-5,5'-disulphonic acid, 3,4'-diaminobenzophenone-3'-sulphonic acid, 4,4'-diamino-diphenyl sulphone, 4,4'-dichloro-3,3'-diamino-diphenyl sulphone, 3,3'-diamino-4-methyl-diphenyl-sulphone-5-sulphonic acid and 3,3'-diaminodiphenyl-sulphone-4,4'-disulphonic acid.

EXAMPLE 7

281 g of 4-aminophenyl-β-sulphatoethyl sulphone are dissolved in about 6,000 ml of water to give a neutral solution. After adding 70 g of sodium nitrite, the solution is run into 250 ml of 10 N hydrochloric acid and the diazo suspension obtained in this way is then added, as described in Example 1, to a solution of the bispyrazolone prepared as described further on in the text from 535 g of 3,3'-bis-[(4-aminophenyl)-amino-sulphonyl]-nickel-phthalocyanine-3'',3'''-disulphonic acid. The pH is then adjusted with 4 N sodium carbonate solution to 7–7.2 and the green dyestuff which has formed is isolated by salting-out or spray-drying. The dyestuff has the following structure:

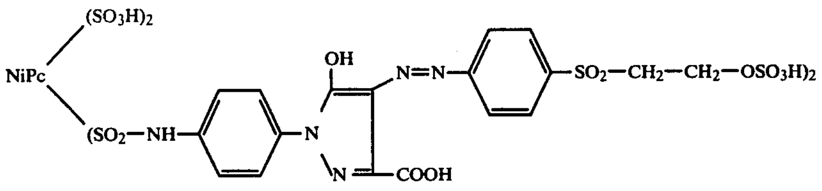

The bispyrazolone employed as the coupling component was prepared in the following manner: 535 g of 3,3'-bis-[(4-amino-phenyl)-amino-sulphonyl[-nickel-phthalocyanine-3",3'"-disulphonic acid, prepared in the customary manner by a condensation reaction between 0.5 mol of nickel phthalocyanine tetrasulphochloride and 1 mol of acetyl-p-phenylenediamine and saponification of the condensation product, are stirred with 3,500 ml of water and are dissolved by adding 200 ml of 10 N sodium hydroxide solution. 70 g of sodium nitrate are added to this solution and the mixture is then stirred into a mixture of 2,000 g of ice and 300 ml of concentrated HCl in the course of about 30 minutes. The temperature is kept between 0° and 5° C. by adding a further 100 g of ice. Stirring is continued for about 10 minutes and any slight excess of nitrite which may be present is then removed by means of amidosulphonic acid. 135 g of acetylsuccinic acid diethyl ester are added to the diazo suspension obtained in this way. The pH is adjusted to about 6 with approximately 250 g of sodium carbonate and is kept at this value until the diazo compound can no longer be detected. This gives a solution of the turquoise-coloured 3,3'-bis-[4-(1,2-bis-ethoxycarbonylethylidene)-hydrazino-phenyl-aminosulphonyl]-nickel-phthalocyanine-3",3'"-disulphonic acid, which is converted direct, by the action of alkali, into the corresponding bispyrazolone, by adding about 400 ml of 10 N sodium hydroxide solution to the mixture and stirring for approximately 4 hours at room temperature.

Obviously many modifications and variations of the present invention are possible in the light of the above teachings. It is, therefore, to be understood that within the scope of the appended claims the invention may be practiced otherwise than as specifically described.

What is claimed:

1. A water-soluble phthalocyanine dye in which there is substituted on the phthalocyanine nucleus up to four groups having the structure

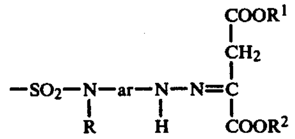

wherein

R is hydrogen or alkyl having up to 6 carbons, $R^1$ is an alkyl radical which has 2–6 carbon atoms and is substituted by Cl, Br, OH or alkoxy having 1–4 carbon atoms, or an unsubstituted alkyl radical having 1–18 carbon atoms, $R_2$ is an alkyl radical which has 2–6 carbon atoms is substituted by Cl, Br, OH or alkoxy having 1–4 carbon atoms, or denotes an unsubstituted alkyl radical having 1–18 carbon atoms, and ar is a carbocyclic divalent aromatic or araliphatic group containing up to two benzene rings and up to 16 carbons, the NH group of the hydrazone moiety being attached to a benzene ring.

* * * * *

UNITED STATES PATENT AND TRADEMARK OFFICE

CERTIFICATE OF CORRECTION

PATENT NO. : 4,204,056

DATED : May 20, 1980

INVENTOR(S) : Rolf Muller et al

It is certified that error appears in the above-identified patent and that said Letters Patent are hereby corrected as shown below:

Title page at No. 75 "United Kingdom" should be replaced by -- Fed. Rep. of Germany --

| Column | Line | Correction |
|---|---|---|
| 22 | 53 and 57 | Change "21 g" to -- 210 g -- |
| 22 | 56 | Change "13 g" to -- 130 g -- |

Signed and Sealed this

*Twenty-eighth* Day of *April 1981*

[SEAL]

*Attest:*

RENE D. TEGTMEYER

*Attesting Officer* *Acting Commissioner of Patents and Trademarks*